United States Patent
Su et al.

(10) Patent No.: US 11,367,494 B2
(45) Date of Patent: Jun. 21, 2022

(54) MEMORY STRUCTURE WITH DOPING-INDUCED LEAKAGE PATHS

(71) Applicant: Taiwan Semiconductor Manufacturing Co., Ltd., Hsinchu (TW)

(72) Inventors: Hsin-Wen Su, Hsinchu (TW); Shih-Hao Lin, Hsinchu (TW); Jui-Lin Chen, Taipei (TW); Lien Jung Hung, Taipei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/007,806

(22) Filed: Aug. 31, 2020

(65) Prior Publication Data
US 2022/0068413 A1   Mar. 3, 2022

(51) Int. Cl.
| H01L 21/76 | (2006.01) |
| H01L 27/108 | (2006.01) |
| G11C 17/16 | (2006.01) |
| H01L 27/112 | (2006.01) |
| H01L 29/06 | (2006.01) |
| H01L 21/265 | (2006.01) |

(52) U.S. Cl.
CPC ............ *G11C 17/16* (2013.01); *H01L 21/265* (2013.01); *H01L 27/11206* (2013.01); *H01L 29/0607* (2013.01)

(58) Field of Classification Search
CPC .................. H01L 29/0607; H01L 27/11206
USPC ................... 438/251, 423, 766; 257/306–310
See application file for complete search history.

(56) References Cited

U.S. PATENT DOCUMENTS

| 7,843,747 | B2 | 11/2010 | Hsueh et al. |
| 8,154,020 | B2 * | 4/2012 | Cho ................ H01L 31/032 257/53 |
| 9,129,827 | B2 * | 9/2015 | Cappellani ....... H01L 21/02488 |
| 9,536,827 | B1 | 1/2017 | Chen et al. |
| 9,577,137 | B2 * | 2/2017 | Cho ................ H01L 31/1804 |
| 9,865,609 | B2 | 1/2018 | Chen et al. |
| 10,593,777 | B2 * | 3/2020 | Kim ................ H01L 29/94 |

(Continued)

FOREIGN PATENT DOCUMENTS

| CN | 112397516 A | * | 2/2021 | ........ H01L 21/11206 |
| JP | 2017162914 A | * | 9/2017 | ........ H01L 27/11206 |
| TW | 200832516 A | * | 8/2008 | ........ H01L 29/42332 |

OTHER PUBLICATIONS

Su, Hsin-Wen, "Semiconductor Memory Structure", U.S. Appl. No. 16/837,227, filed Apr. 1, 2020, Assignee: Taiwan Semiconductor Manufacturing Co., Ltd., 23 pages specification, 7 pages drawings.

*Primary Examiner* — Calvin Lee
(74) *Attorney, Agent, or Firm* — Haynes and Boone, LLP

(57) ABSTRACT

The present disclosure provides semiconductor device and methods of forming the same. A semiconductor device according to the present disclosure includes a gate structure, a source/drain feature adjacent the gate structure, a dielectric layer disclosed over the gate structure and the source/drain feature, a gate contact disposed in the dielectric layer and over the gate structure, and a source/drain contact disposed in the dielectric layer and over the source/drain feature. The dielectric layer is doped with a dopant and the dopant includes germanium or tin.

19 Claims, 8 Drawing Sheets

(56) References Cited

U.S. PATENT DOCUMENTS

| | | |
|---|---|---|
| 10,770,575 B2 * | 9/2020 | Dasgupta ............ H01L 29/7788 |
| 2008/0179762 A1 * | 7/2008 | Cho .................. H01L 29/66825 |
| | | 136/252 |
| 2016/0148705 A1 | 5/2016 | Lee et al. |

* cited by examiner

MEMORY STRUCTURE WITH DOPING-INDUCED LEAKAGE PATHS

BACKGROUND

Among semiconductor memory devices, non-volatile memory (NVM) devices can be used to store data even if power to the memory device is turned off. In various examples, NVM devices may include read only memory (ROM), magnetic memory, optical memory, or flash memory, among other types of NVM devices. NVM devices include multi-time programmable (MTP) memory devices, few-time programmable (FTP) memory devices, and one-time programmable (OTP) memory devices. As its name suggests, OTP NVM devices may only be successfully programmed once while MTP NVM devices may be successfully programmable multiple times. Compared to an MTP NVM device, an OTP NVM device has a simpler construction and a smaller footprint. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology.

OTP NVM devices that use antifuse technology are programmed by electrically shorting the gate and source of a transistor. In an example programming process, a programming voltage in excess of a breakdown voltage of a gate dielectric layer is applied to a gate to cause an avalanche breakdown of the gate dielectric layer. The avalanche breakdown of the gate dielectric layer allows the gate to be shorted to the source. While conventional OTP NVM devices are generally adequate for their intended purposes, they are not satisfactory in all aspects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
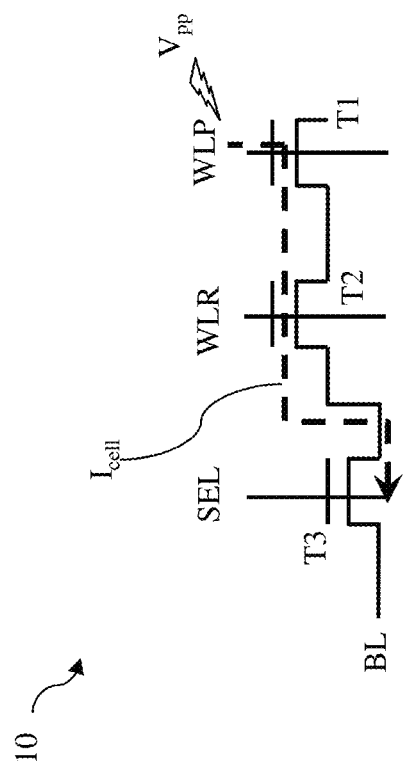
FIG. 1 illustrates a circuit diagram of an equivalent circuit of a portion of an OTP NVM device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Among semiconductor memory devices, non-volatile memory (NVM) devices can be used to store data even if power to the memory device is turned off. NVM devices include multi-time programmable (MTP) memory devices, few-time programmable (FTP) memory devices, and one-time programmable (OTP) memory devices. As its name suggests, OTP NVM devices may only be successfully programmed once while MTP NVM devices may be successfully programmable multiple times. Compared to an MTP NVM device, an OTP NVM device has a simpler construction and a smaller footprint. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology.

An OTP NVM device based on the floating-gate technology includes a floating gate insulated by an oxide layer. Programming a floating-gate OTP NVM device involves applying a high voltage to trap charges on the floating gate and erasing floating-gate OTP NVM device involves depleting the charges trapped on the floating gate. An OTP NVM device based on the eFuse technology includes a narrow-width fuse. Programming an eFuse OTP NVM device involves applying a high voltage across the fuse. The high voltage induces a high current density through the fuse and blows the fuse by operation of accelerated electro-migration. Programmed eFuse OTP NVM devices cannot be erased as the fuse-blowing mechanism is irreversible. An OTP NVM device based on the antifuse technology includes a dielectric layer with a relatively low breakdown voltage. In some conventional technology, an antifuse OTP NVM device includes a thinner gate dielectric layer (i.e., core gate dielectric layer) for some transistors and a thicker gate dielectric layer (i.e., input/output (I/O) gate dielectric layer) for other transistors. When a high programming voltage is applied, the thinner gate dielectric layer breaks down to form a conduction path, allowing a cell current ($I_{cell}$) to flow through. As compared to floating-gate OTP NVM devices and eFuse OTP NVM devices, antifuse OTP NVM devices are more scalable and its implementation requires little or no change to the structures and manufacturing processes.

Operations of an antifuse OTP NVM device are described further in conjunction with FIG. 1, which illustrates a circuit diagram 10 of an equivalent circuit of a portion of an OTP NVM device. As shown in FIG. 1, the circuit diagram 10 includes a first transistor T1, a second transistor T2, and a third transistor T3. The gate of the first transistor T1 is coupled to a programming word line (WLP), which is configured to apply a programming voltage ($V_{pp}$) to program the OTP NVM device. The gate of the second transistor T2 is coupled to a read word line (WLR). The gate of the third transistor T3 is coupled to a select (SEL) node and a source/drain of the third transistor T3 is coupled to a bit line (BL). When the programming voltage ($V_{pp}$) is not applied to program the OTP NVM device and, the second transistor T2 and the second transistor T3 are turned on, only a leakage current flows from the first transistor T1, through the second transistor T2 and the third transistor T3, to the bit line, resulting in a low cell current ($I_{cell}$) and "0" read at the bit line (BL). In an ideal situation, when the programming voltage ($V_{pp}$) is applied to the programming word line (WLP), the programming voltage ($V_{pp}$) is sufficient to break down the gate dielectric layer of the first transistor T1 to produce an increased cell current ($I_{cell}$) through the new leakage path. When the second transistor T2 and the second transistor T3 are turned on, the increased cell current ($I_{cell}$) may flow from the first transistor T1, through the second transistor T2 and the third transistor T3, to the bit line, resulting in "1" read at the bit line. If the programming voltage ($V_{pp}$) is not high enough to break down the gate dielectric layer of the first transistor due to any process variation, the programming of the antifuse OTP NVM may fail. In some instances, the programming may be attempted again.

Conventionally, the programming voltage ($V_{pp}$) is selected to exceed the breakdown voltage of the gate dielectric layer of the first transistor T1. Because the first transistor T1 is not specially and other core transistor share the same gate dielectric layer thickness, the programming voltage ($V_{pp}$) may be between about 4.5 volts and about 5.5 volts. As such a programming voltage may be higher than the supply voltage supplied by input/output devices or a control circuit, structural changes may be needed. In some instances where successful programming is desired, an even higher programming voltage ($V_{pp}$) may be implemented to accommodate possible process variations. For example, when transistors in OTP NVM devices have gate dielectric layers of different thicknesses, the programming voltage may be reliably break down all gate dielectric layers that are supposed to break down. When the programming voltage ($V_{pp}$) inches higher, the supply voltage and power consumption of the OTP NVM device also increase. In some examples, structural changes, such as deep n-type wells, are proposed to withstand to high supply voltages. Such structural changes may complicate manufacturing processes and reduce yield, counteracting the benefits of antifuse OTP NVM devices described above.

The present disclosure provides a process to form a low-breakdown voltage leakage path in an OTP NVM device. In an example process, a workpiece that includes an OTP NVM device is received. The workpiece includes a gate contact and a source/drain contact adjacent to the gate contact. The gate contact and the source/drain contact are embedded in a dielectric layer. In the example process, the workpiece is implanted with a dopant species, such as germanium or tin, to introduce impurities, defects, defects in the dielectric layer. The defects in the dielectric layer reduces the breakdown voltage of the dielectric layer between the gate contact and the source/drain contact to between about 2 volts and about 3 volts, such as 2.5 volts. Accordingly, programming of the OTP NVM device requires a lower programming voltage, such as one between about 2 volts and about 3 volts. In some embodiments, the breakdown of the dielectric layer between the gate contact and the source/drain contact creates a leakage path (or conduction path) that physically extends between the gate contact and the source/drain contact. The leakage path (or conduction path) may include materials from the gate contact and the source/drain contact. By reducing the programming voltage, embodiments of the present disclosure may reduce the power consumption of an OTP NVM device by as much as 90%.

Figure 2:
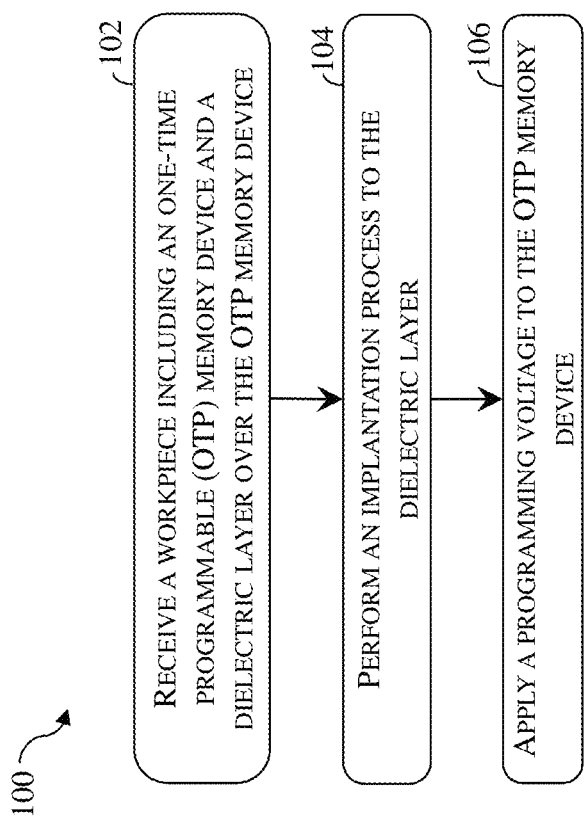
FIG. 2 is flowchart of a method of manufacturing a semiconductor device, according to one or more aspects of the present disclosure.

The various aspects of the present disclosure will now be described in more detail with reference to FIGS. 2-8. FIG. 2 illustrates a flowchart illustrating a method 100 for forming a semiconductor device or a portion thereof from a workpiece, according to one or more aspects of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with fragmentary cross-sectional views or layout views of a workpiece 200 (shown in FIGS. 2-8) at different stages of fabrication according to embodiments of method 100. For avoidance of doubts, throughout the figures, the X direction is perpendicular to the Y direction and the Z direction is perpendicular to both the X direction and the Y direction. It is noted that, because the workpiece 200 may be fabricated into a semiconductor device, the workpiece 200 may be referred to as the semiconductor device 200 as the context requires.

Figure 3:
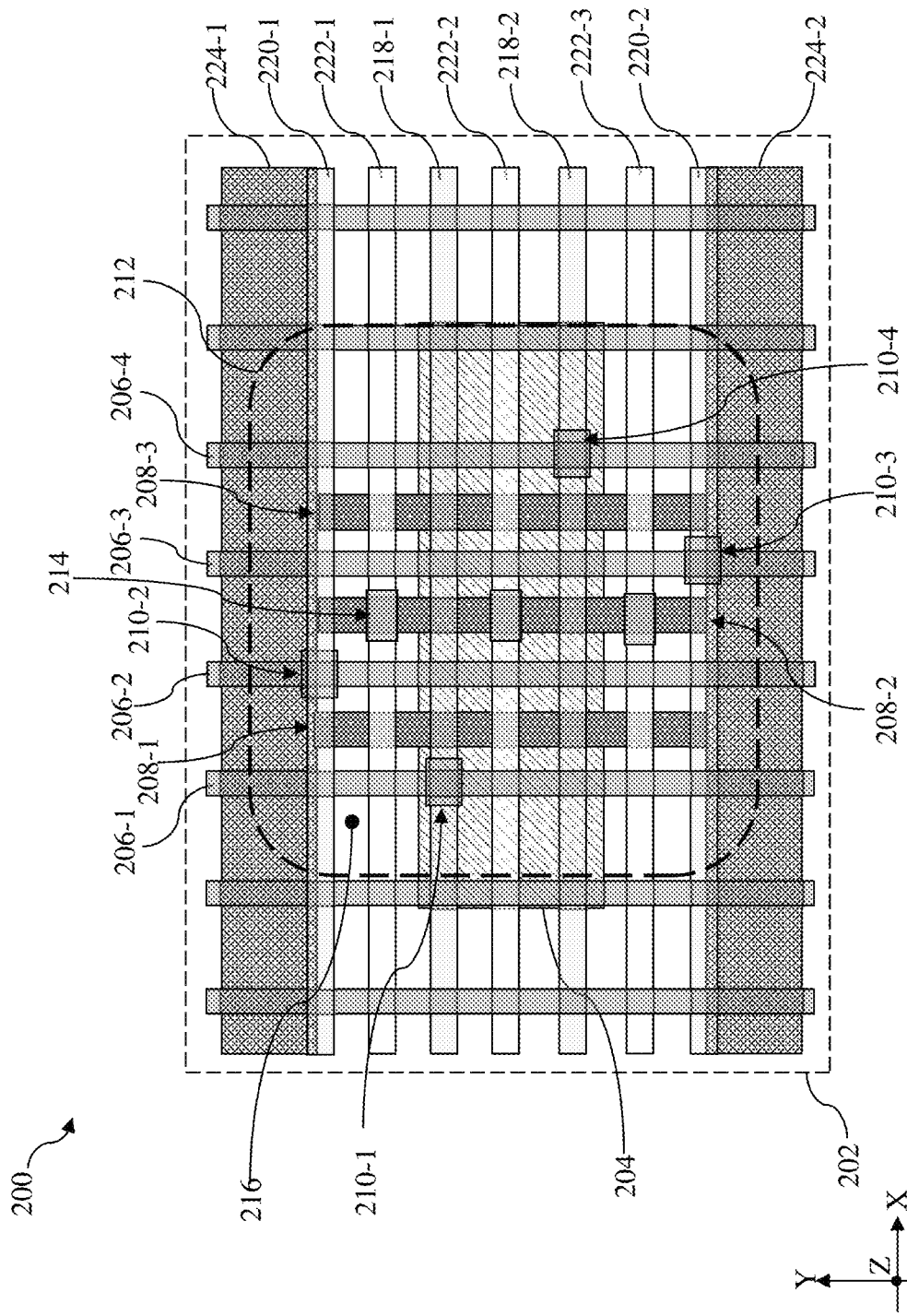
FIG. 3 is a layout view of a semiconductor device, according to one or more aspects of the present disclosure.
Figure 4:
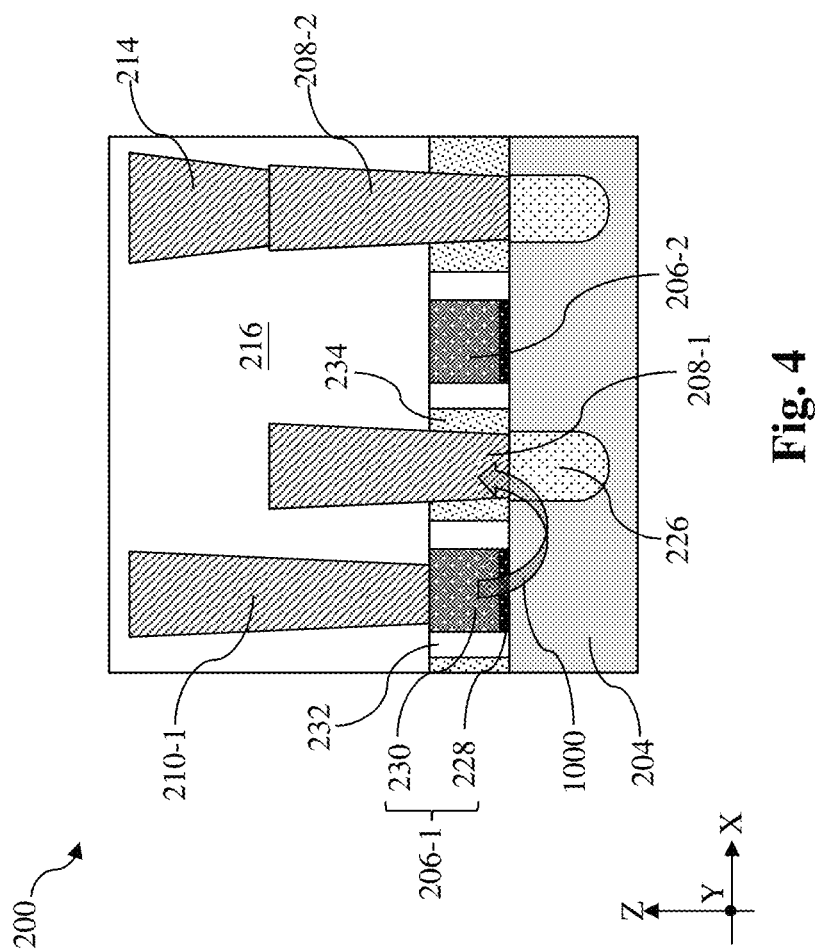
FIG. 4 is fragmentary cross-sectional view of a portion of the semiconductor device of FIG. 3, according to one or more aspects of the present disclosure.

Referring to FIGS. 2, 3 and 4, method 100 includes a block 102 where a workpiece 200 is received. FIG. 3 illustrates a layout view of the workpiece 200. As FIG. 3 illustrates features whose views are blocked by other features, it may be considered a see-through top view of the workpiece 200. The workpiece 200 includes a substrate 202 and an OTP memory device 212 disposed on the substrate 202. The OTP memory device 212 may be an OTP NVM device and includes an active region 204, a first gate structure 206-1, a second gate structure 206-2, a third gate structure 206-3, a fourth gate structure 206-4, a first source/drain contact 208-1, a second source/drain contact 208-2, a third source/drain contact 208-3, a first program word line (WLP0) 218-1, a second program word line (WLP1) 218-2, a first read word line (WLR0) 220-1, a second read word line (WLR1) 220-2, a first bit line 222-1, a second bit line 222-2, a third bit line 222-3, a first isolation structure 224-1, and a second isolation structure 224-2. The first gate structure 206-1 is electrically coupled to the first program word line (WLP0) 218-1 by a first gate contact 210-1. The second gate structure 206-2 is electrically coupled to the first read word line (WLR0) 220-1 by a second gate contact 210-2. The third gate structure 206-3 is electrically coupled to the second read word line (WLR1) 220-2 by a third gate contact 210-3. The fourth gate structure 206-4 is electrically coupled to the second program word line (WLP1) 218-2 by a fourth gate contact 210-4. The second source/drain contact 208-2 is electrically coupled to the first bit line 222-1, the second bit line 222-2, and the third bit line 222-3 by source/drain contact vias 214. The first gate contact 210-1, the second gate contact 210-2, the third gate contact 210-3, the fourth gate contact 210-4, the first source/drain contact 208-1, the second source/drain contact 208-2, the third source/drain contact 208-3, and the source/drain contact vias 214 are disposed/embedded in a first dielectric layer 216. The first dielectric layer 216 is disposed over the substrate 202, including over the first gate structure 206-1, the second gate structure 206-2, the third gate structure 206-3, and the fourth gate structure 206-4.

In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B) or gallium (Ga)), for forming different types of devices. The doping the n-type wells and the p-type wells may be formed using ion implantation or thermal diffusion.

The active region 204 may include a fin structure that rises above the substrate 202. When the active region 204 includes a fin structure, transistors in the semiconductor device 200 may be fin-type field effect transistors (FinFETs). The active region 204 may be formed from patterning the substrate 202 or an epitaxial layer deposited on the substrate 202. Although not explicitly shown in figures, a base portion of the active region 204 is surrounded by an isolation feature to isolate the active region 204 from a neighboring active region. The isolation feature may be a shallow trench isolation (STI) feature. The isolation feature may be composed of silicon oxide, silicon nitride, silicon oxynitride, fluorine-doped silicate glass (FSG), a low-k dielectric, combinations thereof, and/or other suitable material known in the art.

The first gate structure 206-1, the second gate structure 206-2, the third gate structure 206-3, and the fourth gate structure 206-4 are disposed over the active region 204. Precisely speaking, the first gate structure 206-1, the second gate structure 206-2, the third gate structure 206-3, and the fourth gate structure 206-4 are disposed over channel regions of the active region 204. In the embodiments represented in FIG. 3, the active region 204 extends lengthwise along the X direction while the first gate structure 206-1, the second gate structure 206-2, the third gate structure 206-3, and the fourth gate structure 206-4 extend lengthwise along the Y direction, which is perpendicular to the X direction. In FIG. 3, each intersection of the gate structures and the active region 204 defines a transistor in the OTP memory device 212. Each of the first gate structure 206-1, the second gate structure 206-2, the third gate structure 206-3, and the fourth gate structure 206-4 includes a gate dielectric layer over the active region 204 and a gate electrode over the gate dielectric layer. Reference is made to FIG. 4 to illustrate the construction of each of the gate structures by way of an example. As illustrated in FIG. 4, the first gate structure 206-1 includes a gate dielectric layer 228 over the active region 204 and a gate electrode 230 disposed over the gate dielectric layer 228. The other gate structures (the second gate structure 206-2, the third gate structure 206-3, and the fourth gate structure 206-4) may have similar construction and detailed description is omitted.

The gate dielectric layer 228 includes an interfacial layer on the active region 204 and a high-k dielectric layer disposed on the interfacial layer. In some embodiments, the interfacial layer may include silicon oxide layer ($SiO_2$), silicon oxynitride (SiON), or hafnium silicate (HfSiO). In one embodiment, the high-K dielectric layer may include hafnium oxide ($HfO_2$). Alternatively, the high-K dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. In various embodiments, the gate electrode 230 may have a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In some embodiments shown in FIG. 4, sidewalls of the first gate structure 206-1 are lined by a gate spacer 232. The gate spacer 232 may include a dielectric material such as silicon oxide, silicon nitride, silicon carbide, silicon oxynitride, silicon carbonitride, silicon oxycarbonitride, or combinations thereof. Similarly, the other gate structures (the second gate structure 206-2, the third gate structure 206-3, and the fourth gate structure 206-4) are also be lined by the gate spacer 232.

Reference is made to FIGS. 3 and 4. The first gate contact 210-1 is disposed on the first gate structure 206-1 and extends into the first dielectric layer 216. The second gate contact 210-2 is disposed on the second gate structure 206-2 and extends into the first dielectric layer 216. The third gate contact 210-3 is disposed on the third gate structure 206-3 and extends into the first dielectric layer 216. The fourth gate contact 210-4 is disposed on the fourth gate structure 206-4 and extends into the first dielectric layer 216. Each of the first gate structure 206-1, the second gate structure 206-2, the third gate structure 206-3, and the fourth gate structure 206-4 is disposed over a channel region in the active region 204. Source/drain features 226 are disposed in the source/drain regions adjacent the channel regions. Reference is now made to FIG. 4, which illustrates a source/drain feature 226 in relation to adjacent structures. As illustrated in FIG. 4, the first source/drain contact 208-1 is disposed over the source/drain feature 226, which is disposed between two channel regions overlapped by the first gate structure 206-1 and the second gate structure 206-2. As shown in FIG. 4, the source/drain feature 226 is adjacent to the first gate structure 206-1 and the second gate structure 206-2. In some implementations, the first source/drain contact 208-1 may be directly in contact with the source/drain feature 226. In some implementations not explicitly shown in the figures, a silicide layer is sandwiched between the first source/drain contact 208-1 and the source/drain feature 226. Such a silicide layer may include titanium silicide (TiSi), titanium silicon nitride (TiSiN), tantalum silicide (TaSi), tungsten silicide (WSi), cobalt silicide (CoSi), or nickel silicide (NiSi). Each of the source/drain contacts is disposed between two gate structures.

As representatively shown in FIG. 4, the first source/drain contact 208-1 is disposed between the first gate structure 206-1 and the second gate structure 206-2 and extends into the dielectric layer. Each of the source/drain contacts may be spaced apart from the gate spacer 232 by a contact etch stop layer (CESL) 234. The CESL 234 may include silicon nitride, silicon oxide, silicon oxynitride, and/or other materials known in the art. The source/drain contact vias 214 are disposed on the second source/drain contact 208-2 and in the first dielectric layer 216. The first gate contact 210-1, the second gate contact 210-2, the third gate contact 210-3, the fourth gate contact 210-4, the first source/drain contact 208-1, the second source/drain contact 208-2, the third source/drain contact 208-3, and the source/drain contact vias 214 may include copper (Cu), aluminum (Al), tungsten (W), ruthenium (Ru), nickel (Ni), cobalt (Co), or other appropriate metal or metal alloy. Additionally, although not explicitly shown in FIG. 4, sidewalls of each of the first gate contact 210-1, the second gate contact 210-2, the third gate contact 210-3, the fourth gate contact 210-4, the first source/drain contact 208-1, the second source/drain contact 208-2, the third source/drain contact 208-3, and the source/drain contact vias 214 may be separated from the first dielectric layer 216 by a barrier layer. The barrier layer may include titanium nitride (TiN), titanium (Ti), tantalum (Ta), tantalum nitride (TaN), nickel nitride (NiN), or cobalt nitride (CoN).

The first dielectric layer 216 may be an interlayer dielectric (ILD) layer and may include tetraethylorthosilicate (TEOS) oxide, undoped silicate glass (USG), borophosphosilicate glass (BPSG), fluorosilicate glass (FSG), phosphosilicate glass (PSG), or boron doped silicon glass (BSG). Referring to FIG. 4, the minimum distance between the first gate contact 210-1 and the first source/drain contact 208-1 is greater than a thickness of the gate dielectric layer 228. For example, the minimum distance between the first gate contact 210-1 and the first source/drain contact 208-1 may be between about 5 nm and about 10 nm while the thickness of the gate dielectric layer 228 is between about 1 nm and about 3 nm. Because of that, when a programming voltage is applied to the first gate contact 210-1, the gate dielectric layer 228 would break down while the dielectric layer would not. The breakdown of the gate dielectric layer 228 would result in a first leakage path 1000 from the gate electrode 230, through the active region 206 and the source/drain feature 226, and to the first source/drain contact 208-1. It is observed that the breakdown of the gate dielectric layer 228 may require a programming voltage between about 4.5 volts and about 5.5 volts. As described above, such a high programming voltage (between about 4.5 volts and about 5.5 volts) may increase power consumption and may require additional features and structures to increase the supply voltage.

The first program word line (WLP0) 218-1, the second program word line (WLP1) 218-2, the first read word line (WLR0) 220-1, the second read word line (WLR1) 220-2, the first bit line 222-1, the second bit line 222-2, and the third bit line 222-3 may be metal lines formed within a metal-0 (M0) interconnect layer. These metal lines may include copper (Cu), aluminum (Al), tungsten (W), ruthenium (Ru), nickel (Ni), cobalt (Co), or other appropriate metal or metal alloy and extend lengthwise along the X direction. The first isolation structure 224-1 and the second isolation structure 224-2 may be dummy fins or dielectric fins that are formed of one or more dielectric materials, such as silicon oxide, silicon nitride, or silicon oxynitride. The first isolation structure 224-1 and the second isolation structure 224-2 also extend lengthwise along the X direction.

Figure 5:
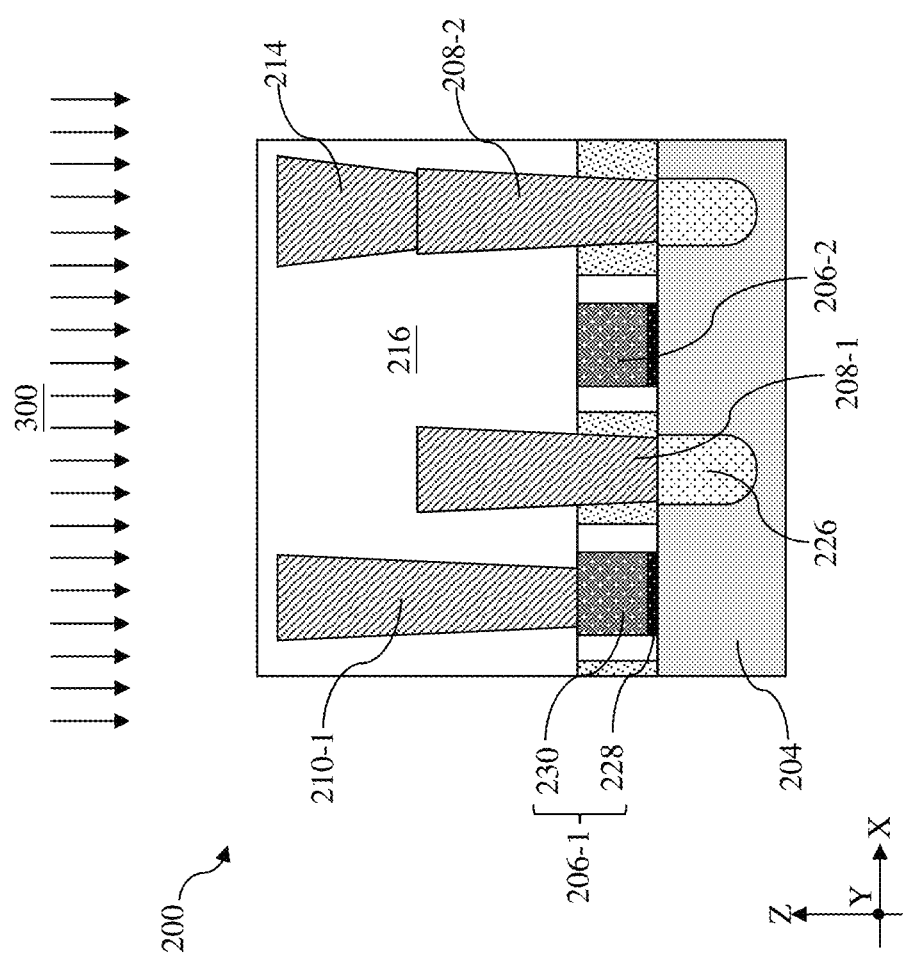
FIG. 5 is fragmentary cross-sectional view of a portion of the semiconductor device undergoing an implantation process, according to one or more aspects of the present disclosure.
Figure 6:
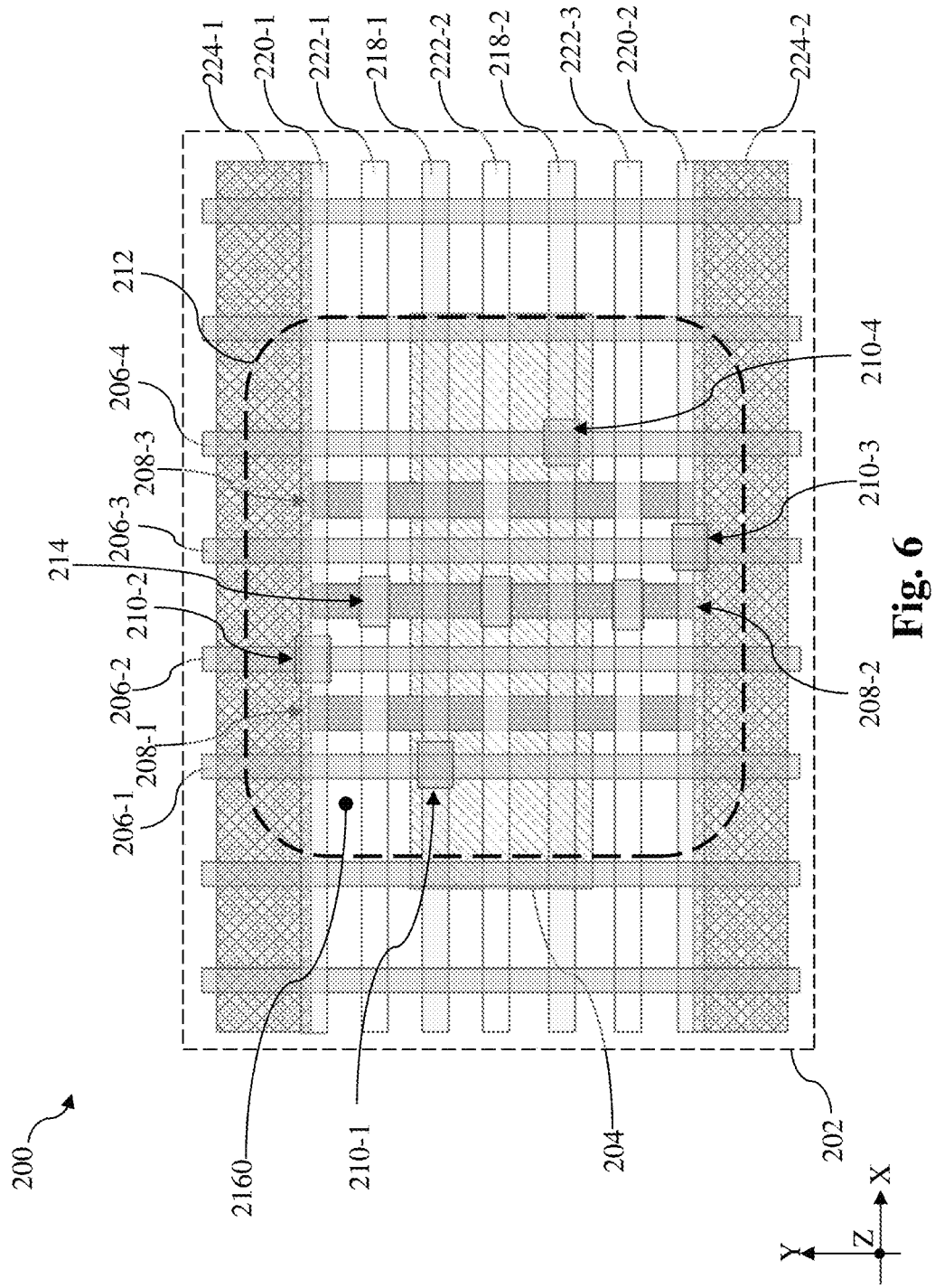
FIG. 6 is a layout view of a semiconductor device after an implantation process representatively shown in FIG. 5, according to one or more aspects of the present disclosure.
Figure 7:
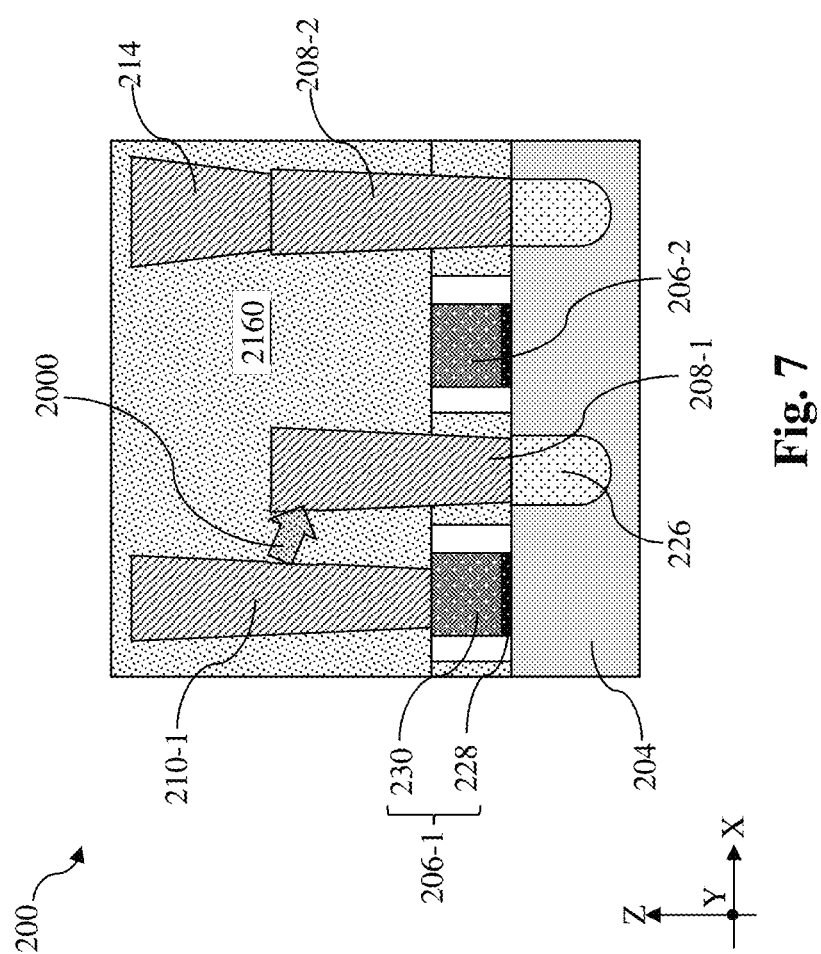
FIG. 7 is fragmentary cross-sectional view of a portion of the semiconductor device after an implantation process representatively shown in FIG. 5, according to one or more aspects of the present disclosure.

Referring to FIGS. 2, 5, 6, and 7, method 100 includes a block 104 where an implantation process 300 is performed to the first dielectric layer 216. In FIG. 5, the implantation process 300 is configured to introduce defects and impurities in the first dielectric layer 216. In some embodiments, the implantation process 300 may implant a dopant in group 4A of the period table, such as germanium (Ge) or tin (Sn), to introduce defects and impurities in the first dielectric layer 216. In some other embodiments, the implantation process may implant an inert gas species, such as xenon or argon, to introduce defects and vacancies in the first dielectric layer 216. The implantation process 300 may include an implantation dose between about $5 \times 10^{14}$ atoms/cm$^2$ and about $1 \times 10^{15}$ atoms/cm$^2$. In some implementation, the implantation process 300 may include an ion implantation energy between about 5 keV and about 30 keV. Reference is now made to FIGS. 6 and 7. For ease of reference, the first dielectric layer 216 that has been implanted by the implantation process 300 may be referred to as a second dielectric layer 2160. It is observed that the defects, impurities, and vacancies resulted from the implantation process 300 may trap charges and facilitate the percolation process that leads to breakdown of the second dielectric layer 2160. In other words, the implantation process 300 at block 104 effectively lowers the breakdown voltage of the dielectric layer. According to the present disclosure, due to the implantation process 300, the breakdown voltage of the second dielectric layer 2160 between the first gate contact 210-1 and the first source/drain contact 208-1 becomes lower than the breakdown voltage of the gate dielectric layer 228.

In some embodiments, a programming voltage between about 2 volts and about 3 volts is sufficient to break down the second dielectric layer 2160 between the first gate contact 210-1 and the first source/drain contact 208-1. Because a programming voltage between about 2 volts and about 3 volts is not sufficient to break down the gate dielectric layer 228, the gate dielectric layer 228 remains intact. Because of that, when a programming voltage between about 2 volts and about 3 volts is applied to the first gate contact 210-1, the gate dielectric layer 228 would break down along a second leakage path 2000 while the dielectric layer would not. The second leakage path 2000 traverses the second dielectric layer 2160 between the first gate contact 210-1 and the first source/drain contact 208-1. To ensure that the depth of the implantation process 300 reaches the area between the first gate contact 210-1 and the first source/drain contact 208-1, the implantation process 300 includes an ion implantation energy between about 5 keV and about 30 keV. To ensure that the programming voltage falls between about 2 volts and about 3 volts, the implantation process includes a dose between about $5\times10^{14}$ atoms/cm$^2$ and about $1\times10^{15}$ atoms/cm$^2$. When the dose is below $5\times10^{14}$ atoms/cm$^2$, the implantation process 300 may not be sufficient to lower the breakdown voltage of the second dielectric layer 2160 to the desired level. When the dose is over $1\times10^{15}$ atoms/cm$^2$, the implantation process 300 may unduly lower the breakdown voltage of the second dielectric layer 2160 to a level where the OTP memory device 212 fails. For example, when the dose is over $1\times10^{15}$ atoms/cm$^2$, the second dielectric layer 2160 between the second gate contact 210-2 (shown in FIG. 6) and the first source/drain contact 208-1 may break down during a read operation of the OTP memory device 212. During a read operation, a read voltage between about 0.5 volts and about 1.5 volt may be applied at the second gate contact 210-2. After the implantation process 300, the second dielectric layer 2160 may include a dopant concentration between about $5\times10^{14}$ atoms/cm$^3$ and about $1\times10^{15}$ atoms/cm$^3$, where the dopant may include germanium or tin, as described above.

Figure 8:
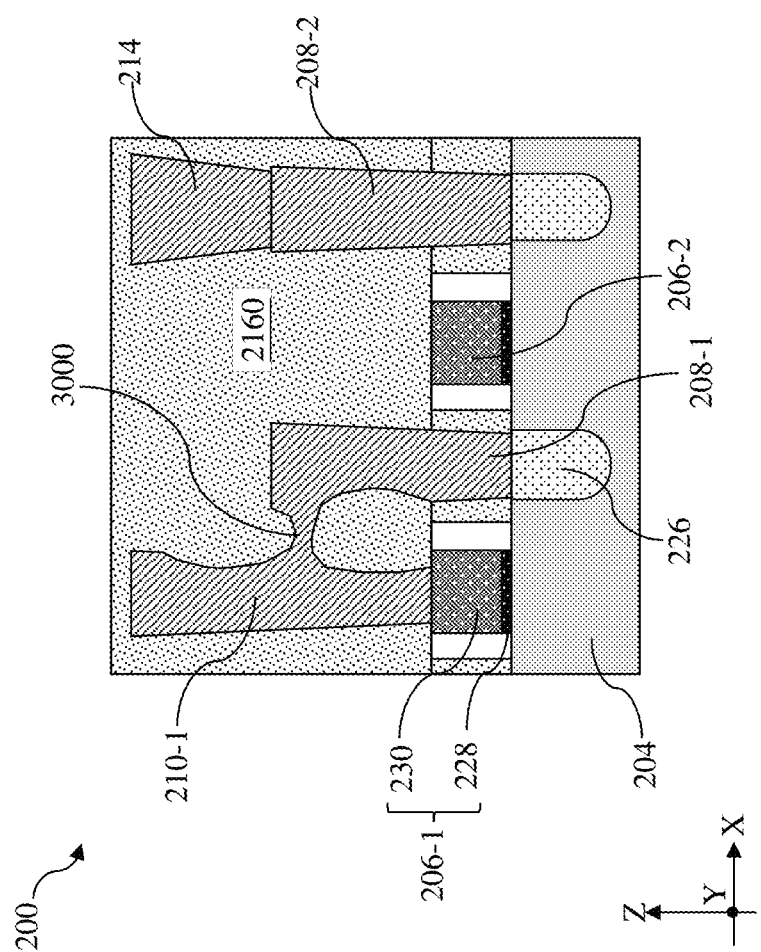
FIG. 8 is fragmentary cross-sectional view of a portion of the semiconductor device after a programming operation, according to one or more aspects of the present disclosure.

Referring to FIGS. 2 and 8, method 100 includes a block 106 where a programming voltage is applied to the OTP memory device 212. At block 106, a programming voltage between about 2 volts and about 3 volts is applied to the first word line (WLP0) 218-1 and the second word line (WLP1) 218-2. By way of the first gate contact 210-1 and the fourth gate contact 210-4, the programming voltage is applied to the first gate structure 206-1 and the fourth gate structure 206-4, respectively. Because the programming voltage between about 2 volts and about 3 volts is insufficient to break down the gate dielectric layer 228, the gate dielectric layer 228 remains intact. However, as described above, the programming voltage between about 2 volts and about 3 volts is sufficient to break down the second dielectric layer 2160 between the first gate contact 210-1 and the first source/drain contact 208-1 and between the fourth gate contact 210-4 and the third source/drain contact 208-3.

Experiments and microscopic images indicate that the application of the programming voltage may result in a leakage feature due to electro-migration. FIG. 8 illustrates a leakage feature 3000 between the first gate contact 210-1 and the first source/drain contact 208-1. The leakage feature 3000 includes materials of the first gate contact 210-1 and the first source/drain contact 208-1. For example, the leakage feature 3000 may include copper (Cu), aluminum (Al), tungsten (W), ruthenium (Ru), nickel (Ni), cobalt (Co), titanium nitride (TiN), titanium (Ti), tantalum (Ta), tantalum nitride (TaN), nickel nitride (NiN), or cobalt nitride (CoN).

The various embodiments described herein offer several advantages over the existing art. It will be understood that not all advantages have been necessarily discussed herein, no particular advantage is required for all embodiments, and other embodiments may offer different advantages. As one example, methods of the present disclosure shift a programming leakage path of an OTP memory device from the gate dielectric layer of a gate structure to an interlayer dielectric (ILD) layer between a gate contact and a source/drain contact. By implanting the ILD layer with a dopant, such as germanium or tin, methods of the present disclosure lower the break down voltage of the interlayer dielectric (ILD) layer to a level lower than a break down voltage of the gate dielectric layer. The leakage path in the ILD layer between a gate contact and a source/drain contact allows a programming voltage between about 2 volts and about 3 volts. Compared to a higher programming voltage required to break down the gate dielectric layer, the lower programming voltage enabled by the present disclosure may reduce power consumption and improve yield. Additionally, upon application of the programming voltage, a leakage feature may be formed in the ILD layer between a gate contact and a source/drain contact. The leakage feature may include materials found in the gate contact or the source/drain contact.

Thus, in one aspect, the present disclosure provides a semiconductor device. The semiconductor device includes a gate structure, a source/drain feature adjacent the gate structure, a dielectric layer disclosed over the gate structure and the source/drain feature, a gate contact disposed in the dielectric layer and over the gate structure, a source/drain contact disposed in the dielectric layer and over the source/drain feature The dielectric layer is doped with a dopant and the dopant includes germanium or tin.

In some embodiments, a concentration of the dopant in the dielectric layer is between about $5\times10^{14}$ atoms/cm$^3$ and about $1\times10^{15}$ atoms/cm$^3$. In some implementations, a breakdown voltage of the dielectric layer between the gate contact and the source/drain contact is between about 2 volts and about 3 volts. In some embodiments, the gate structure includes a gate dielectric layer and a breakdown voltage of the gate dielectric layer is greater than a breakdown voltage of the dielectric layer between the gate contact and the source/drain contact. In some instances, the semiconductor device further includes a leakage path between the gate contact and the source/drain contact. The leakage path electrically couples the gate contact and the source/drain contact. In some instances, the leakage path physically extends through a portion of the dielectric layer. In some embodiments, the leakage path includes materials of the gate contact or materials of the source/drain contact. In some embodiments, the dielectric layer includes tetraethylorthosilicate (TEOS) oxide, undoped silicate glass (USG), borophosphosilicate glass (BPSG), fluorosilicate glass (FSG), phosphosilicate glass (PSG), or boron doped silicon glass (BSG).

In another aspect, the present disclosure provides a one-time-programmable (OTP) memory device. The OTP memory device includes an active region, a first gate structure and a second gate structure over the active region, a dielectric layer disclosed over the first gate structure and the second gate structure, a first source/drain contact disposed between the first gate structure and the second gate structure, a second source/drain contact spaced apart from the first source/drain contact by the second gate structure, and a first gate contact disposed over and electrically coupled to the first gate structure. A portion of the first source/drain contact, a portion of the second source/drain contact, and the first gate contact are disposed within the dielectric layer. The dielectric layer includes a dopant and the dopant includes germanium or tin.

In some embodiments, a concentration of the dopant in the dielectric layer is between about $5\times10^{14}$ atoms/cm$^3$ and about $1\times10^{15}$ atoms/cm$^3$. In some implementations, a breakdown voltage of the dielectric layer between the first gate contact and the first source/drain contact is between about 2 volts and about 3 volts. In some instances, the second source/drain contact is coupled to a bit line by way of a source/drain contact via. In some embodiments, the OTP memory device may further include a leakage path between the first gate contact and the first source/drain contact; and a second gate contact disposed over and electrically coupled to the second gate structure. The second gate contact is disposed within the dielectric layer and a portion of the dielectric layer between the second gate contact and the first source/drain contact is free of a leakage path. In some embodiments, the first gate contact is coupled to a program word line, the second gate contact is coupled to a read word line, the first gate structure and the second gate structure extend lengthwise along a first direction, and the program word line and the read word line extend lengthwise along a second direction perpendicular to the first direction.

In yet another aspect, the present disclosure provides a method. The method includes receiving a workpiece that includes a dielectric layer, a gate contact disposed in the dielectric layer, and a source/drain contact adjacent the gate contact and disposed in the dielectric layer. The method further includes, after receiving the workpiece, implanting the dielectric layer with a dopant.

In some embodiments, the dopant is an element of group 4A of the periodic table. In some implementations, the dopant includes germanium or tin. In some embodiments, the implanting of the dielectric layer reduces a breakdown voltage of the dielectric layer between the gate contact and the source/drain contact. In some embodiments, the implanting of the dielectric layer includes a dose between about $5\times10^{14}$ atoms/cm$^2$ and about $1\times10^{15}$ atoms/cm$^2$. In some instances, the implanting of the dielectric layer includes an implantation energy between about 5 keV and about 30 keV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
   a gate structure comprising a gate dielectric layer,
   a dielectric layer over the gate structure,
   a gate contact disposed in the dielectric layer and directly over the gate structure, the gate contact being physically and electrically coupled to the gate structure, and
   a source/drain contact adjacent the gate contact and disposed in the dielectric layer;
   after receiving the workpiece, implanting the dielectric layer with a dopant; and
   applying a voltage across the gate contact and the source/drain contact to form a leakage path through the dielectric layer,
   wherein the voltage is equal to or greater than a breakdown voltage of the dielectric layer between the gate contact and the source/drain contact, but is smaller than a breakdown voltage of the gate dielectric layer.

2. The method of claim 1, wherein the implanting of the dielectric layer reduces a breakdown voltage of the dielectric layer between the gate contact and the source/drain contact.

3. The method of claim 1, wherein the implanting of the dielectric layer comprises a dose between about $5\times10^{14}$ atoms/cm$^2$ and about $1\times10^{15}$ atoms/cm$^2$.

4. The method of claim 1, wherein the implanting of the dielectric layer comprises an implantation energy between about 5 keV and about 30 keV.

5. The method of claim 1, wherein the dopant is an element of group 4A of the periodic table.

6. The method of claim 1, wherein the dopant comprises germanium or tin.

7. A semiconductor device, comprising:
   a gate structure;
   a source/drain feature adjacent the gate structure;
   a dielectric layer disclosed over the gate structure and the source/drain feature;
   a gate contact disposed in the dielectric layer and directly over the gate structure, the gate contact being physically and electrically coupled to the gate structure;
   a source/drain contact disposed in the dielectric layer and over the source/drain feature; and
   a leakage path between the gate contact and the source/drain contact to couple the gate contact and the source/drain contact,
   wherein the dielectric layer is doped with germanium or tin.

8. The semiconductor device of claim 7,
   wherein the gate structure comprises a gate dielectric layer,
   wherein a breakdown voltage of the gate dielectric layer is greater than a breakdown voltage of the dielectric layer between the gate contact and the source/drain contact.

9. The semiconductor device of claim 7, wherein the dielectric layer comprises tetraethylorthosilicate (TEOS) oxide, undoped silicate glass (USG), borophosphosilicate glass (BPSG), fluorosilicate glass (FSG), phosphosilicate glass (PSG), or boron doped silicon glass (BSG).

10. The semiconductor device of claim 7, wherein a breakdown voltage of the dielectric layer between the gate contact and the source/drain contact is between about 2 volts and about 3 volts.

11. The semiconductor device of claim 7, wherein a concentration of the dopant in the dielectric layer is between about $5\times10^{14}$ atoms/cm$^3$ and about $1\times10^{15}$ atoms/cm$^3$.

12. The semiconductor device of claim 7, wherein the leakage path comprises materials of the gate contact or materials of the source/drain contact.

13. The semiconductor device of claim 7, wherein the leakage path physically extends through a portion of the dielectric layer.

14. A one-time programmable (OTP) memory device, comprising:
   an active region;

a first gate structure and a second gate structure over the active region, the first gate structure comprising a gate dielectric layer;

a dielectric layer disclosed over the first gate structure and the second gate structure;

a first source/drain contact disposed between the first gate structure and the second gate structure;

a second source/drain contact spaced apart from the first source/drain contact by the second gate structure; and a first gate contact disposed directly on and electrically coupled to the first gate structure, the first gate contact being physically and electrically coupled to the first gate structure, wherein a portion of the first source/drain contact, a portion of the second source/drain contact, and the first gate contact are disposed within the dielectric layer, wherein the dielectric layer is doped with a germanium or tin, and wherein a breakdown voltage of the gate dielectric layer is greater than a breakdown voltage of the dielectric layer.

15. The OTP memory device of claim 14, wherein a breakdown voltage of the dielectric layer between the first gate contact and the first source/drain contact is between about 2 volts and about 3 volts.

16. The OTP memory device of claim 14, wherein a concentration of the dopant in the dielectric layer is between about $5 \times 10^{14}$ atoms/cm$^3$ and about $1 \times 10^{15}$ atoms/cm$^3$.

17. The OTP memory device of claim 14, wherein the second source/drain contact is coupled to a bit line by way of a source/drain contact via.

18. The OTP memory device of claim 14, further comprising:

a leakage path between the first gate contact and the first source/drain contact; and a second gate contact disposed over and electrically coupled to the second gate structure, wherein the second gate contact is disposed within the dielectric layer, wherein a portion of the dielectric layer between the second gate contact and the first source/drain contact is free of a leakage path.

19. The OTP memory device of claim 18, wherein the first gate contact is coupled to a program word line, wherein the second gate contact is coupled to a read word line, wherein the first gate structure and the second gate structure extend lengthwise along a first direction, wherein the program word line and the read word line extend lengthwise along a second direction perpendicular to the first direction.

* * * * *